(12) United States Patent
Chien et al.

(10) Patent No.: US 11,191,149 B2
(45) Date of Patent: *Nov. 30, 2021

(54) HEAT DISSIPATION ASSEMBLY OF M.2 EXPANSION CARD AND ELECTRONIC DEVICE

(71) Applicant: GIGA-BYTE TECHNOLOGY CO., LTD., New Taipei (TW)

(72) Inventors: Yuan-Li Chien, New Taipei (TW); Yen-Yun Chang, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/736,840

(22) Filed: Jan. 8, 2020

(65) Prior Publication Data

US 2020/0170101 A1 May 28, 2020

Related U.S. Application Data

(62) Division of application No. 16/252,708, filed on Jan. 21, 2019, now Pat. No. 10,645,794.

(30) Foreign Application Priority Data

Nov. 27, 2018 (TW) ................................ 107142152

(51) Int. Cl.
| | | |
|---|---|---|
| H05K 1/02 | (2006.01) | |
| H05K 7/10 | (2006.01) | |
| H01R 12/73 | (2011.01) | |

(52) U.S. Cl.
CPC ........... *H05K 1/0201* (2013.01); *H01R 12/73* (2013.01); *H05K 7/10* (2013.01);
(Continued)

(58) Field of Classification Search
CPC ......... H01L 2924/0002; H01L 2924/00; H01L 23/4006; H01L 23/40; H01L 21/4871;
(Continued)

(56) References Cited

U.S. PATENT DOCUMENTS 9,564,712 B1 * 2/2017 Shih ........................ G06F 1/185
9,703,331 B1 * 7/2017 Chien ..................... G06F 1/187
(Continued)

FOREIGN PATENT DOCUMENTS

| TW | M547692 | 8/2017 |
|----|---------|--------|
| TW | M565468 | 8/2018 |

OTHER PUBLICATIONS

"Office Action of Taiwan Counterpart Application", dated Nov. 30, 2020, p. 1-p. 6.

*Primary Examiner* — Mandeep S Buttar
(74) *Attorney, Agent, or Firm* — JCIPRNET

(57) ABSTRACT

A heat dissipating assembly of M.2 expansion card is adapted to fix an M.2 expansion card to a motherboard, and includes a heat dissipating body having a first end and a locking member. The heat dissipating body includes a fixed portion located at the first end and at least one screw hole, and the heat dissipating body is adapted to be fixed to the motherboard through the fixed portion. The locking member is detachably disposed on the at least one screw hole, and the locking member is adapted to fix the M.2 expansion card to the heat dissipating body.

3 Claims, 8 Drawing Sheets

(52) U.S. Cl.
CPC ............... *H05K 2201/066* (2013.01); *H05K 2201/10393* (2013.01); *H05K 2201/10409* (2013.01)

(58) Field of Classification Search
CPC ............ H01L 21/4882; H01L 23/4093; H01L 2023/405; G06F 1/20; G06F 1/185; G06F 1/186; G06F 1/184; G06F 13/409; G06F 1/206; H05K 1/0203; H05K 7/1408; H05K 7/20736; H05K 1/144; H05K 1/14; H05K 1/148; H05K 7/1404; H05K 1/0201; H01R 12/721; H01R 12/73
USPC ........... 361/679.32, 801, 679.4, 679.54, 704, 361/679.58, 709, 807, 225.11, E23.083
See application file for complete search history.

(56) References Cited

U.S. PATENT DOCUMENTS

| | | | | |
|---|---|---|---|---|
| 10,152,097 B1* | 12/2018 | Huang | ............... | H05K 7/20418 |
| 10,154,578 B2* | 12/2018 | Lai | ............... | H01L 23/4006 |
| 10,359,815 B1* | 7/2019 | Lin | ............... | H01R 12/7082 |
| 10,394,291 B2* | 8/2019 | Kho | ............... | H05K 7/1402 |
| 2018/0295710 A1* | 10/2018 | Lai | ............... | H05K 7/20472 |
| 2019/0141172 A1* | 5/2019 | Chen | ............... | H04N 5/2251 |
| 2019/0361506 A1* | 11/2019 | Keilers | ............... | H05K 7/1402 |

* cited by examiner

US 11,191,149 B2

HEAT DISSIPATION ASSEMBLY OF M.2 EXPANSION CARD AND ELECTRONIC DEVICE

CROSS-REFERENCE TO RELATED APPLICATION

This application is a divisional application of and claims the priority benefit of U.S. application Ser. No. 16/252,708, filed on Jan. 21, 2019, now pending, which claims the priority benefit of Taiwan application serial no. 107142152, filed on Nov. 27, 2018. The entirety of each of the above-mentioned patent applications is hereby incorporated by reference herein and made a part of this specification.

BACKGROUND OF THE INVENTION

Field of the Invention

The invention relates to a heat dissipating assembly and an electronic device, and more particularly, to a heat dissipating assembly of M.2 expansion card and an electronic device.

Description of Related Art

At present, a relatively large number of electronic devices are provided with M.2 connectors for connecting M.2 expansion cards on the motherboard to facilitate expansion by users. Since the M.2 expansion cards have different sizes, the existing motherboard needs to be provided with at least 2 to 3 screw holes adjacent to the M.2 connectors to fix expansion cards of different sizes on the motherboard.

However, in recent years, with the evolution of technology, such as advances in cloud computing, the demand for CPUs to deliver high-speed signals has increased. In particular, more wiring configurations are needed between the PCI-E interface and the CPU. However, most of the connectors of the M.2 expansion cards are disposed between the PCI-E interface and the CPU. In particular, the motherboard needs to be provided with a plurality of screw holes for fixing the M.2 expansion cards on the motherboard in this area, such that the layout of the wiring between the PCI-E interface and the CPU is more difficult.

SUMMARY OF THE INVENTION

The invention provides a heat dissipating assembly of M.2 expansion card. An M.2 expansion card may be fixed on a motherboard through the heat dissipating assembly of the M.2 expansion card.

The invention provides an electronic device having the heat dissipating assembly of M.2 expansion card. The electronic device allows the motherboard to require only a single M.2 fixing hole to fix various sizes of the M.2 expansion card and the heat dissipating assembly of the M.2 expansion card, thus reducing the difficulty of wiring on the motherboard.

A heat dissipating assembly of M.2 expansion card of the invention is adapted to fix an M.2 expansion card to a motherboard, and includes a heat dissipating body having a first end and a locking member. The heat dissipating body includes a fixed portion located at the first end and at least one screw hole, and the heat dissipating body is adapted to be fixed on the motherboard through the fixed portion. The locking member is detachably disposed on one of the screw holes, and the locking member is adapted to fix the M.2 expansion card to the heat dissipating body, wherein the at least one screw hole comprises a plurality of screw holes, the locking member is detachably disposed on one of the screw holes, and the screw holes are spaced apart on the heat dissipating body, and the locking member is adapted to lock one of the screw holes through the lower surface of the heat dissipating body.

In an embodiment of the invention, the heat dissipating assembly of the M.2 expansion card further has at least one clamping arm, and the clamping arm is extended from at least one side of the heat dissipating body. The clamping arm is adapted to detachably clamp the M.2 expansion card. When the M.2 expansion card is disposed on the heat dissipating assembly, the heat dissipating body is located at one surface of the M.2 expansion card, and the at least one clamping arm is hooked on another surface of the M.2 expansion card.

In an embodiment of the invention, the locking member includes a stud or a screw.

In an embodiment of the invention, the heat dissipating body has a second end opposite to the first end. The heat dissipating body further includes a tongue located at the second end.

An electronic device of the invention is adapted to configure an M.2 expansion card and includes a motherboard and a heat dissipating assembly of an M.2 expansion card. The motherboard includes an M.2 connector and a single M.2 fixing hole. The heat dissipating assembly of the M.2 expansion card is detachably disposed at a portion on the motherboard adjacent to the M.2 connector and adapted to fix the M.2 expansion card on the motherboard. The heat dissipating assembly of the M.2 expansion card further includes a heat dissipating body having a first end and a locking member. The heat dissipating body includes a fixed portion located at the first end and at least one screw hole. The fixed portion is detachably fixed on the M.2 fixing hole of the motherboard. The locking member is detachably disposed on one of the screw holes and is adapted to fix the M.2 expansion card to the heat dissipating body, wherein the at least one screw hole comprises a plurality of screw holes, the locking member is detachably disposed on one of the screw holes, and the screw holes are spaced apart on the heat dissipating body, and the locking member is adapted to lock one of the screw holes through the lower surface of the heat dissipating body.

In an embodiment of the invention, the heat dissipating assembly of the M.2 expansion card further has at least one clamping arm, and the clamping arm is extended from at least one side of the heat dissipating body. The clamping arm is adapted to detachably clamp the M.2 expansion card. When the M.2 expansion card is disposed on the heat dissipating assembly, the heat dissipating body is located at one surface of the M.2 expansion card, and the at least one clamping arm is hooked on another surface of the M.2 expansion card.

In an embodiment of the invention, the locking member includes a stud or a screw.

In an embodiment of the invention, the heat dissipating body has a second end opposite to the first end. The heat dissipating body further includes a tongue located at the second end. The motherboard further includes a tongue slot located on the M.2 connector and corresponding to the tongue. When the heat dissipating assembly of the M.2 expansion card is disposed on the motherboard, the tongue is extended into the tongue slot.

Based on the above, the heat dissipating assembly of M.2 expansion card of the electronic device of the invention not only may provide heat dissipation function to the M.2 expansion card, the user may also fix the M.2 expansion card on the motherboard through the heat dissipating assembly of the M.2 expansion card. In other words, the user may fix the M.2 expansion card and the heat dissipating body together through the locking member. The heat dissipating assembly of M.2 expansion card of the invention may be fixed on the motherboard through the M.2 fixing hole of the motherboard of the electronic device, and the heat dissipating body is fixed to the motherboard together with the M.2 expansion card. In addition, the motherboard of the electronic device of the invention only needs to provide a single M.2 fixing hole for each M.2 connector, and the M.2 expansion card does not need to be fixed by configuring a plurality of M.2 fixing holes adjacent to the M.2 connector as in the prior art. Therefore, the motherboard of the electronic device of the invention may save some of the space of the conventional M.2 fixing holes to make the layout of the wiring on the motherboard more flexible.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
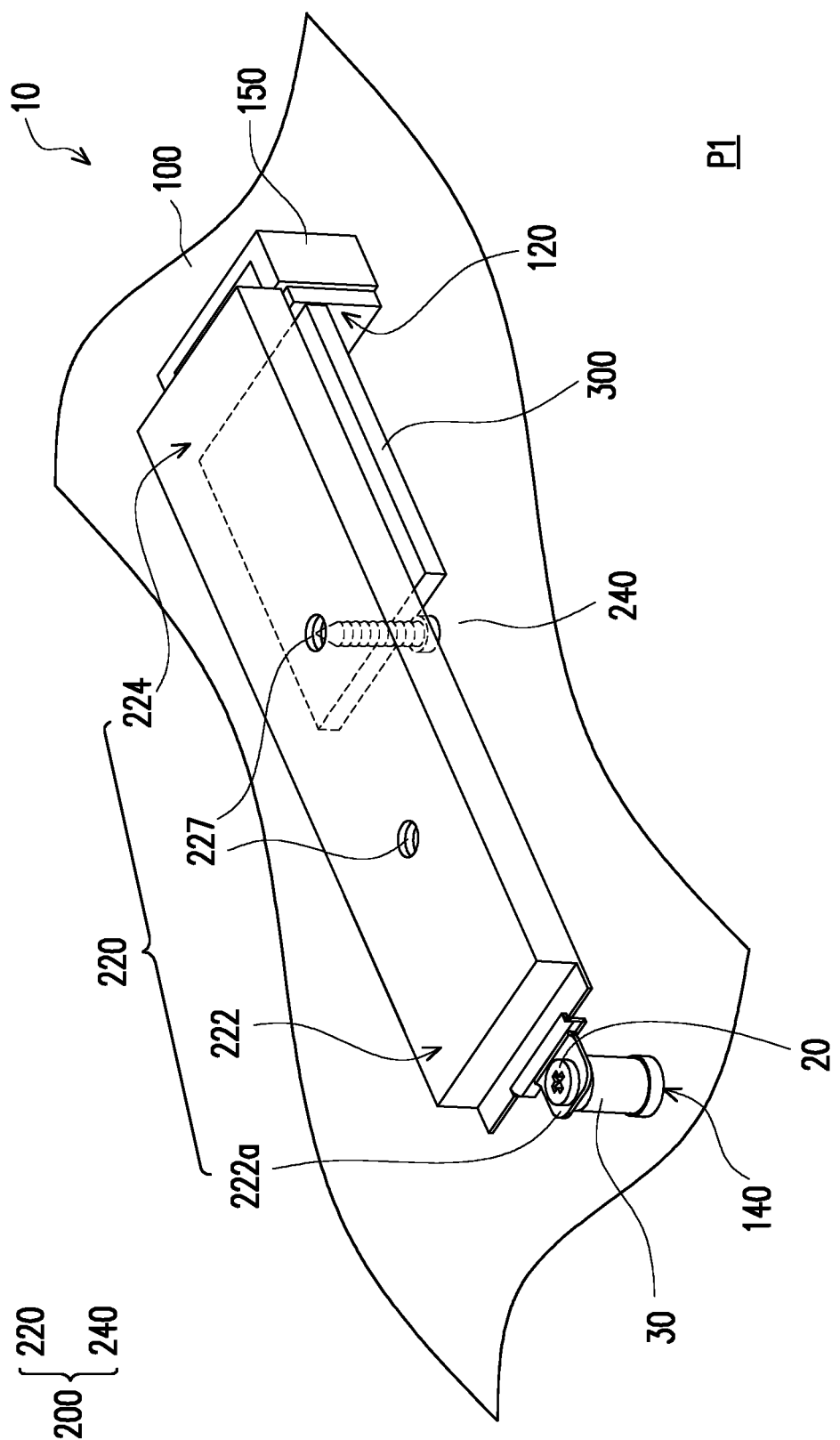
FIG. 1 is a schematic of an electronic device located at a first position and fixed to a motherboard according to an embodiment of the invention.
Figure 2:
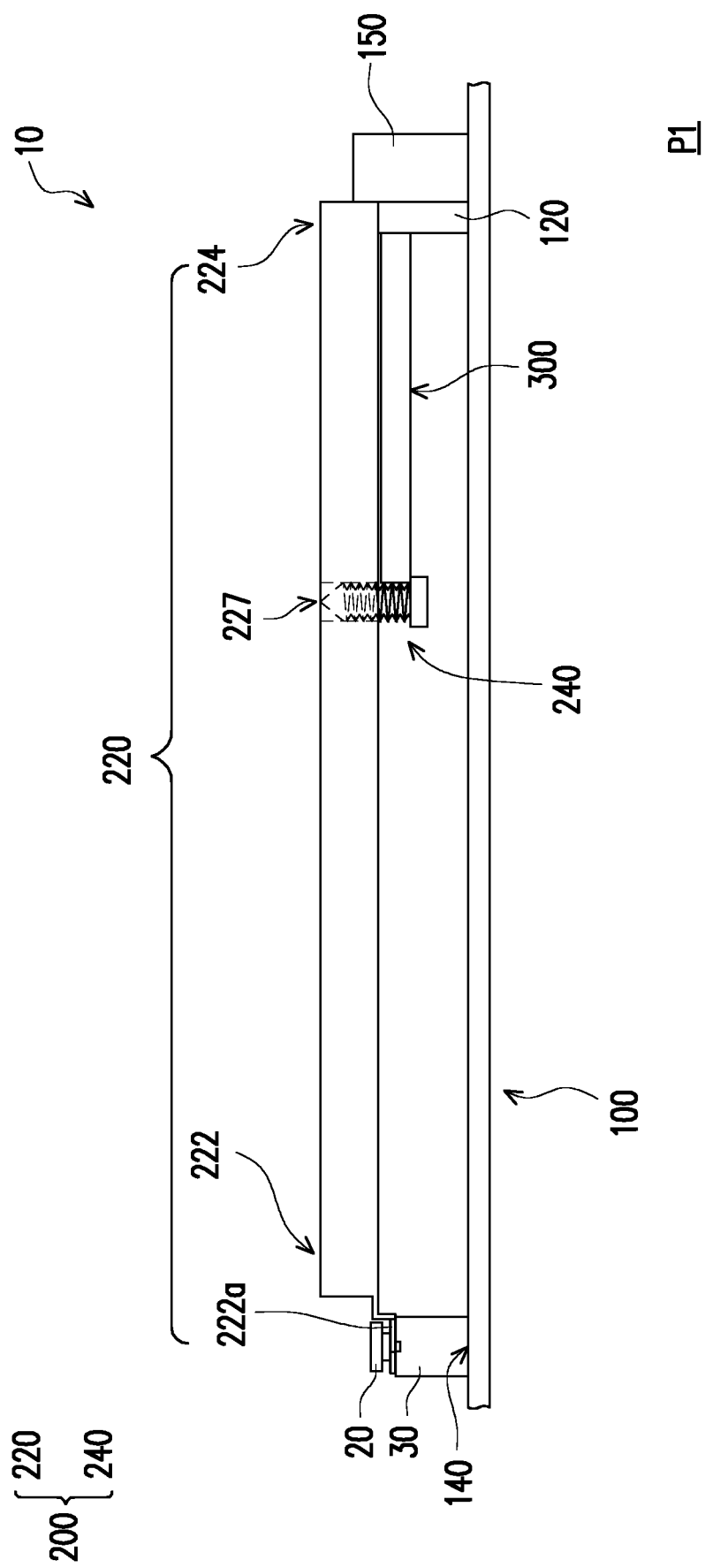
FIG. 2 is a side view of a heat dissipating assembly of an M.2 expansion card of the electronic device of FIG. 1.

FIG. 1 is a schematic of an electronic device located at a first position and fixed to a motherboard according to an embodiment of the invention. FIG. 2 is a side view of a heat dissipating assembly of an M.2 expansion card of the electronic device of FIG. 1. Referring to FIG. 1 and FIG. 2, an electronic device 10 of the present embodiment includes a motherboard 100 and a heat dissipating assembly of M.2 expansion card 200. The motherboard 100 includes an M.2 connector 120 and a single M.2 fixing hole 140. In addition, the M.2 connector 120 of the electronic device 10 may configure an M.2 expansion card 300. The heat dissipating assembly of M.2 expansion card 200 includes a heat dissipating body 220 and a locking member 240. The heat dissipating body 220 has a first end 222 and a second end 224 opposite to the first end 222. In addition, the heat dissipating body 220 further includes a fixed portion 222a located at the first end 222 and at least one screw hole 227.

It is worth mentioning that in the present embodiment, the heat dissipating assembly of M.2 expansion card 200 of the electronic device 10 applies for a plurality of M.2 expansion card 300 sizes. For example, the size of the M.2 expansion card 300 may be a sized of model 2230, 2242, 2260 or 2280, and the invention is not limited thereto.

As shown in FIG. 1, in the present embodiment, the locking member 240 of the heat dissipating assembly of M.2 expansion card 200 includes, for example, a screw. The at least one screw hole 227 on the heat dissipating body 220 includes a plurality of screw holes 227, and the number of the screw holes 227 is, for example, two. Further, a plurality of screw holes 227 are spaced apart on the heat dissipating body 220, and the arrangement locations of the plurality of screw holes 227 are on the midline extended from the first end 222 to the second end 224 along the heat dissipating body 220. The positions of the screw holes 227 correspond to various sizes of the M.2 expansion card 300 to detachably fix the M.2 expansion card 300 on the heat dissipating body 220 in conjunction with the locking member 240.

Furthermore, as may be seen from FIG. 2, when a screw (the locking member 240) is fixed on the screw hole 227, the stud portion of the screw (the locking member 240) may be abutted against the edge of the M.2 expansion card 300 opposite to another side of the M.2 connector 120 to ensure that the M.2 expansion card 300 is stably inserted into the M.2 connector 120 on the motherboard 100. In addition, the nut of the screw (the locking member 240) slightly holds the M.2 expansion card 300 such that the M.2 expansion card 300 more stably fits the heat dissipating body 220.

It should be noted that, in the present embodiment, the material of the heat dissipating assembly of M.2 expansion card 200 may be a material facilitating heat dissipation such as aluminum, carbonized alloy, or copper, but the invention is not limited thereto. In addition, as shown in FIG. 1, in order to facilitate the expression of the plurality of screw holes 227 on the heat dissipating body 220, in the drawings of the invention, the surface of the heat dissipating body 220 is shown as a plane, but is not limited thereto. Of course, in other embodiments, the heat dissipating body 220 may also be, for example, a fin or other shapes facilitating the heat dissipation of the heat dissipating assembly of M.2 expansion card 200.

Figure 3:
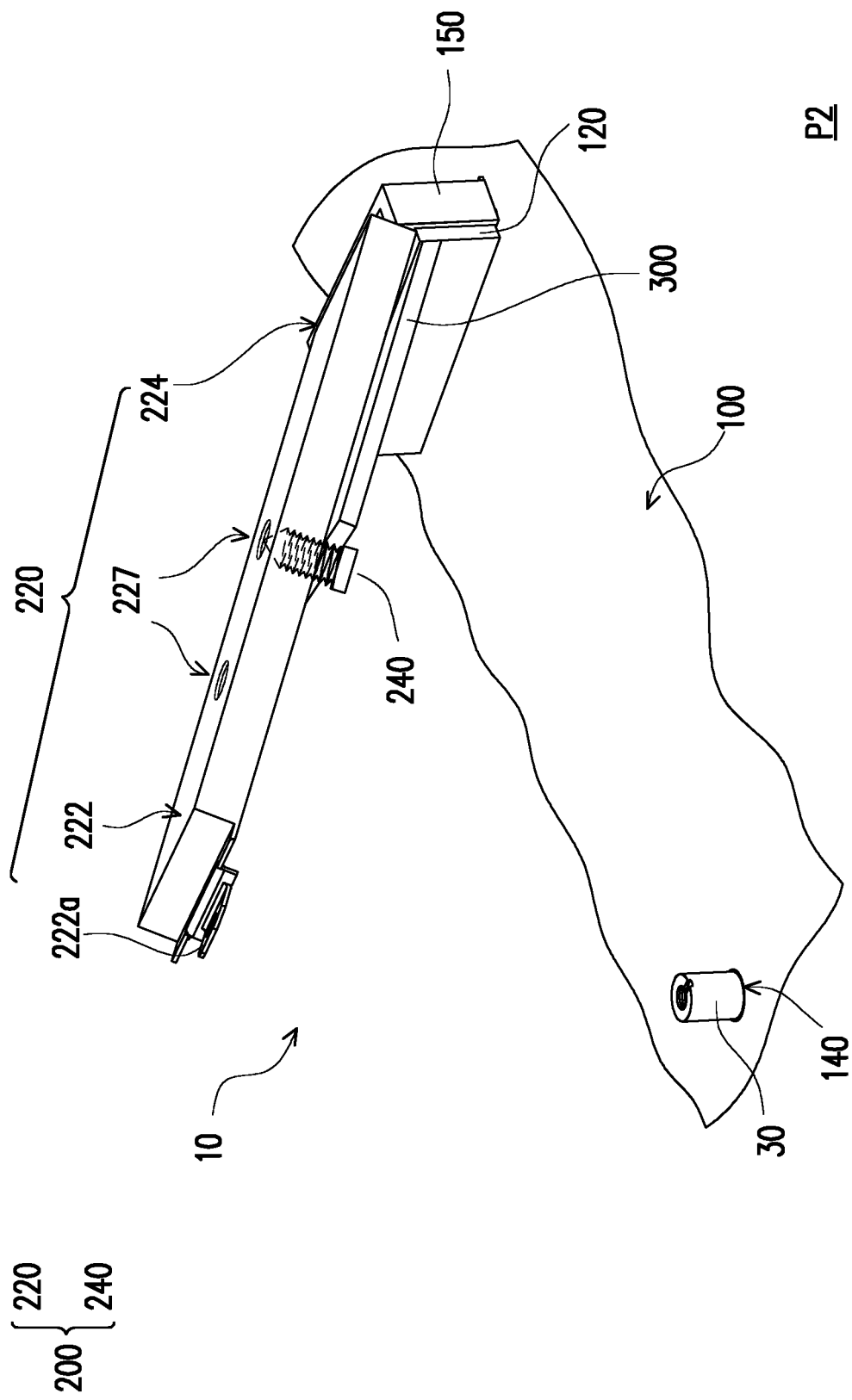
FIG. 3 is a schematic of the electronic device of FIG. 1 disposed on a motherboard and located at a second position.
Figure 4:
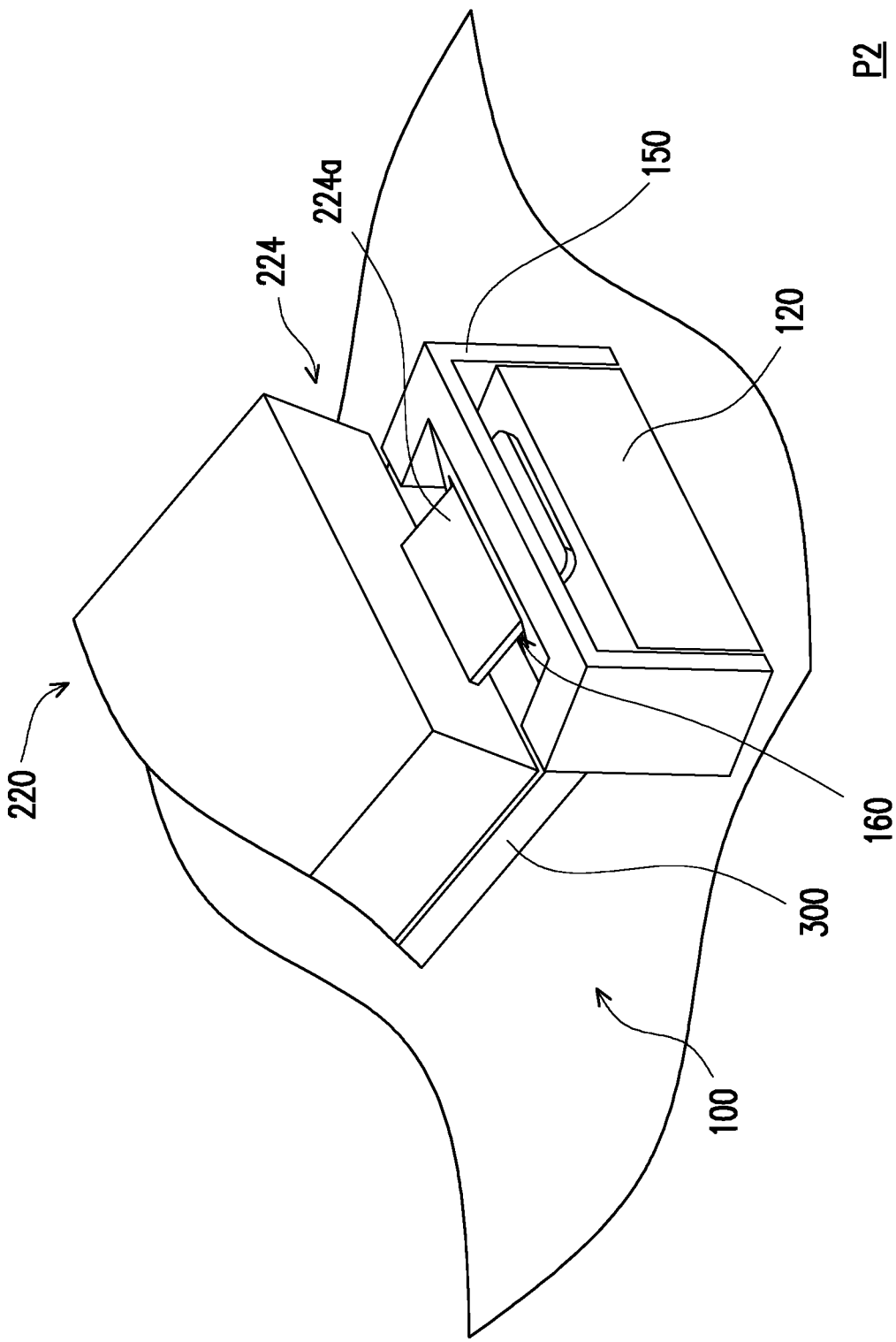
FIG. 4 is a partially enlarged schematic of FIG. 3 from another viewing angle.

FIG. 3 is a schematic of the electronic device of FIG. 1 disposed on a motherboard and located at a second position. FIG. 4 is a partially enlarged schematic of FIG. 3 from another viewing angle. Please refer to FIG. 3 and FIG. 4. In the present embodiment, the heat dissipating assembly of M.2 expansion card 200 is detachably disposed at a portion on the motherboard 100 adjacent to the M.2 connector 120. In addition, the heat dissipating body 220 further includes a tongue 224a located at the second end 224 of the heat dissipating body 220. The motherboard 100 also includes a tongue slot 160 located on the M.2 connector 120 and corresponding to the tongue 224a.

In detail, in the present embodiment, as shown in FIG. 4, the electronic device 10 further has a connector housing 150.

The connector housing 150 is disposed over the M.2 connector 120 of the motherboard 100, and the tongue slot 160 is formed at the connector housing 150. Of course, in other embodiments, the connector housing 150 may be in other forms, and the connector housing 150 does not necessarily cover the M.2 connector 120 on the motherboard 100. The connector cover 150 only needs to provide placement for the tongue slot 160 and fix the tongue slot 160 and the M.2 connector 120 on the motherboard 100, and the invention is not limited thereto. In addition, when the heat dissipating assembly of M.2 expansion card 200 is disposed on the motherboard, the tongue 224a located at the second end 224 of the heat dissipating body 220 of the heat dissipating assembly of M.2 expansion card 200 is extended into the tongue slot 160 of the motherboard 100.

Further, the user detachably fixes the M.2 expansion card 300 to the heat dissipating body 220 through the locking member 240 of the heat dissipating assembly of M.2 expansion card 200. At this time, the user only needs to insert the tongue 224a of the heat dissipating body 220 into the tongue slot 160 of the motherboard 100 and simultaneously insert the M.2 expansion card 300 into the M.2 connector 120 of the motherboard 100. The heat dissipating assembly of M.2 expansion card 200 and the M.2 expansion card 300 are stacked and held at a second position P2 as shown in FIG. 3.

Next, please refer to all of FIG. 1 to FIG. 4. In the present embodiment, the locking member 240 of the heat dissipating assembly of M.2 expansion card 200 detachably fixes the M.2 expansion card 300 together with the heat dissipating body 220 and holds them at the second position P2. The user only needs to press the first end 222 of the heat dissipating body 220 of the heat dissipating assembly of M.2 expansion card 200, and the M.2 expansion card 300 may be moved together with the heat dissipating assembly of M.2 expansion card 200 from the second position P2 shown in FIG. 3 to the first position P1 shown in FIG. 1 to fit the motherboard 100. At this time, the heat dissipating assembly of M.2 expansion card 200 is fixed on the motherboard 100 through the fixed portion 222a of the heat dissipating body 220. It is worth mentioning that in the present embodiment, the sequence of operations described is merely an example. For example, the user may also first insert the M.2 expansion card 300 into the M.2 connector 120 of the motherboard 100 and then detachably fix the M.2 expansion card 300 to the heat dissipating body 220 through the locking member 240 of the heat dissipating assembly of M.2 expansion card 200. Of course, in other embodiments, the user may also have other installation sequences, and the invention is not limited thereto.

It should be noted that, in the present embodiment, for example, the fixed portion 222a of the heat dissipating body 220 may be a through-hole for a screw 20 to pass through the fixed portion 222a of the heat dissipating body 220 to fix the heat dissipating body 220 on the motherboard 100. In addition, since the distance between the heat dissipating body 220 of the heat dissipating assembly of M.2 expansion card 200 and the motherboard 100 has a certain height, in the present embodiment, a convex locking portion 30 is disposed on the motherboard 100. Therefore, the screw 20 may be stably locked to the convex locking portion 30 after passing through the fixed portion 222a of the heat dissipating body 220. Of course, in other embodiments, the fixed portion 222a may be, for example, a structure such as a snap, a latch, or the like, and is not limited thereto.

In addition, in the present embodiment, the tongue 224a of the heat dissipating assembly shown in FIG. 4 and the tongue slot 160 of the motherboard 100 are only examples, and in other embodiments not shown, as long as a detachable fixing method is used, the invention is not limited thereto. More specifically, in an embodiment not shown, the heat dissipating assembly of M.2 expansion card 200 may not even have the tongue 224a, and the motherboard 100 may not require the tongue slot 160. In other words, the user only needs to first fix the heat dissipating assembly of M.2 expansion card 200 and the M.2 expansion card 300 together by the locking member 240 and then insert the M.2 expansion card 300 to the M.2 connector 120 on the motherboard 100. As a result, the heat dissipating assembly of M.2 expansion card 200 and the M.2 expansion card 300 may still be held at the second position P2 shown in FIG. 3. Similarly, the user only needs to press the first end 222 of the heat dissipating body 220 of the heat dissipating assembly of M.2 expansion card 200, and the M.2 expansion card 300 may be moved together with the heat dissipating assembly of M.2 expansion card 200 from the second position P2 shown in FIG. 3 to the first position P1 shown in FIG. 1 to fit the motherboard 100. Then, the user only needs to fix the fixed portion 222a of the heat dissipating body 220 to the M.2 fixing hole 140 on the motherboard 100, and the M.2 expansion card 300 may be fixed on the motherboard 100 by the heat dissipating assembly of M.2 expansion card 200.

It should be mentioned here that, the following embodiments adopt the reference numerals of the embodiments above and a portion of the contents thereof, wherein the same numerals are used to represent the same or similar devices and descriptions of the same technical contents are omitted. The omitted portions are as described in the embodiments above and are not repeated in the embodiments below.

Figure 5:
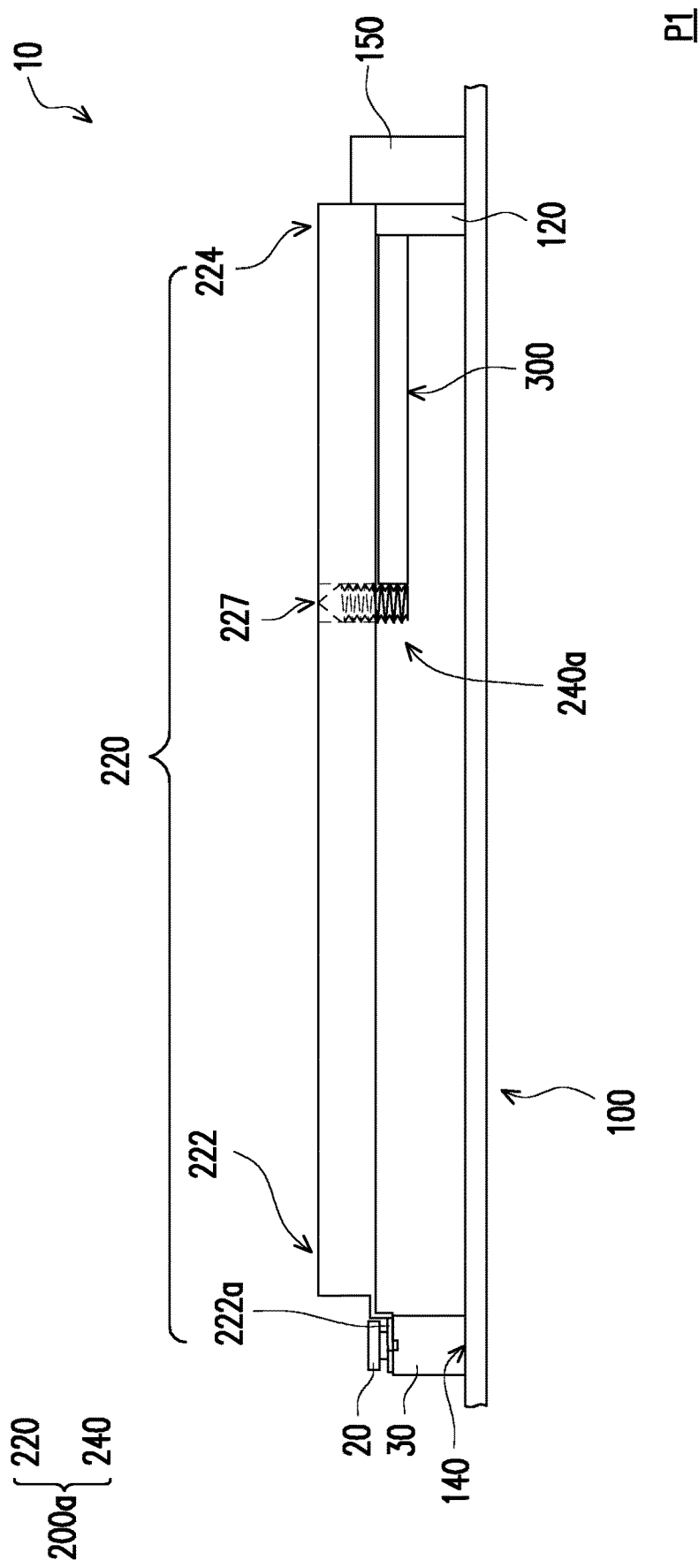
FIG. 5 is a side view of a heat dissipating assembly of an M.2 expansion card according to another embodiment of the invention.

FIG. 5 is a side view of a heat dissipating assembly of an M.2 expansion card according to another embodiment of the invention. Please refer to FIG. 5. In the present embodiment, the locking member 240 of a heat dissipating assembly of M.2 expansion card 200a may be a stud (the locking member 240a) in addition to, for example, a screw. Further, when the user inserts the M.2 expansion card 300 on the M.2 connector 120 on the motherboard 100, the M.2 connector 120 itself has a partial effect of fixing the M.2 expansion card 300. Therefore, the user may also hold the M.2 expansion card 300 without a screw (the locking member 240). That is, the user only needs to fix the stud (the locking member 240a) without a nut on the screw hole 227 of the heat dissipating body 220 and lean the stud (the locking member 240a) against an edge of the M.2 expansion card 300 opposite to another side of the M.2 connector 120 to ensure that the M.2 expansion card 300 does not slip, and then the user may fix the M.2 expansion card 300 to the heat dissipating body 220.

Figure 6:
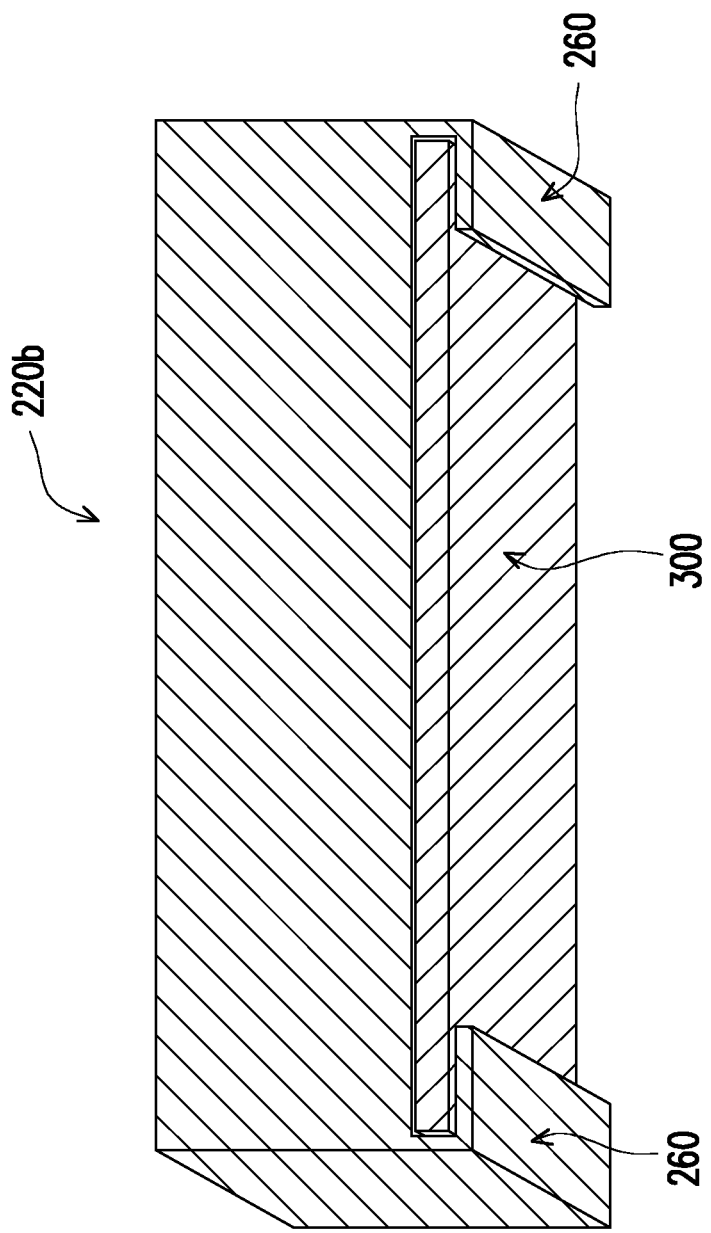
FIG. 6 is a cross section of a heat dissipating assembly of an M.2 expansion card of an electronic device along an extending direction of a first end and a second end according to still another embodiment of the invention.

FIG. 6 is a cross section of a heat dissipating assembly of an M.2 expansion card of an electronic device along an extending direction of a first end and a second end according to still another embodiment of the invention. Referring to FIG. 6, in the present embodiment, a heat dissipating body 220b further has at least one clamping arm 260. The clamping arm 260 is extended from at least one side of the heat dissipating body 220b, and the clamping arm 260 may detachably clamp the M.2 expansion card 300.

In detail, when the user inserts the M.2 expansion card 300 into the M.2 connector 120 on the motherboard 100 (FIG. 1), the user fixes the M.2 expansion card 300 to the heat dissipating body 220b using the locking member 240 (FIG. 1). At this time, the heat dissipating body 220b is located at one side of the M.2 expansion card 300, and the clamping arm 260 is hooked on another side of the M.2 expansion card 300. The clamping arm 260 of the further ensures that the M.2 expansion card 300 may be stably fixed with the heat dissipating body 220 without slipping. In the present embodiment, as shown in FIG. 6, the number of the at least one clamping arm 260 is, for example, two. Of course, in other embodiments, the invention is not limited thereto.

Figure 7:
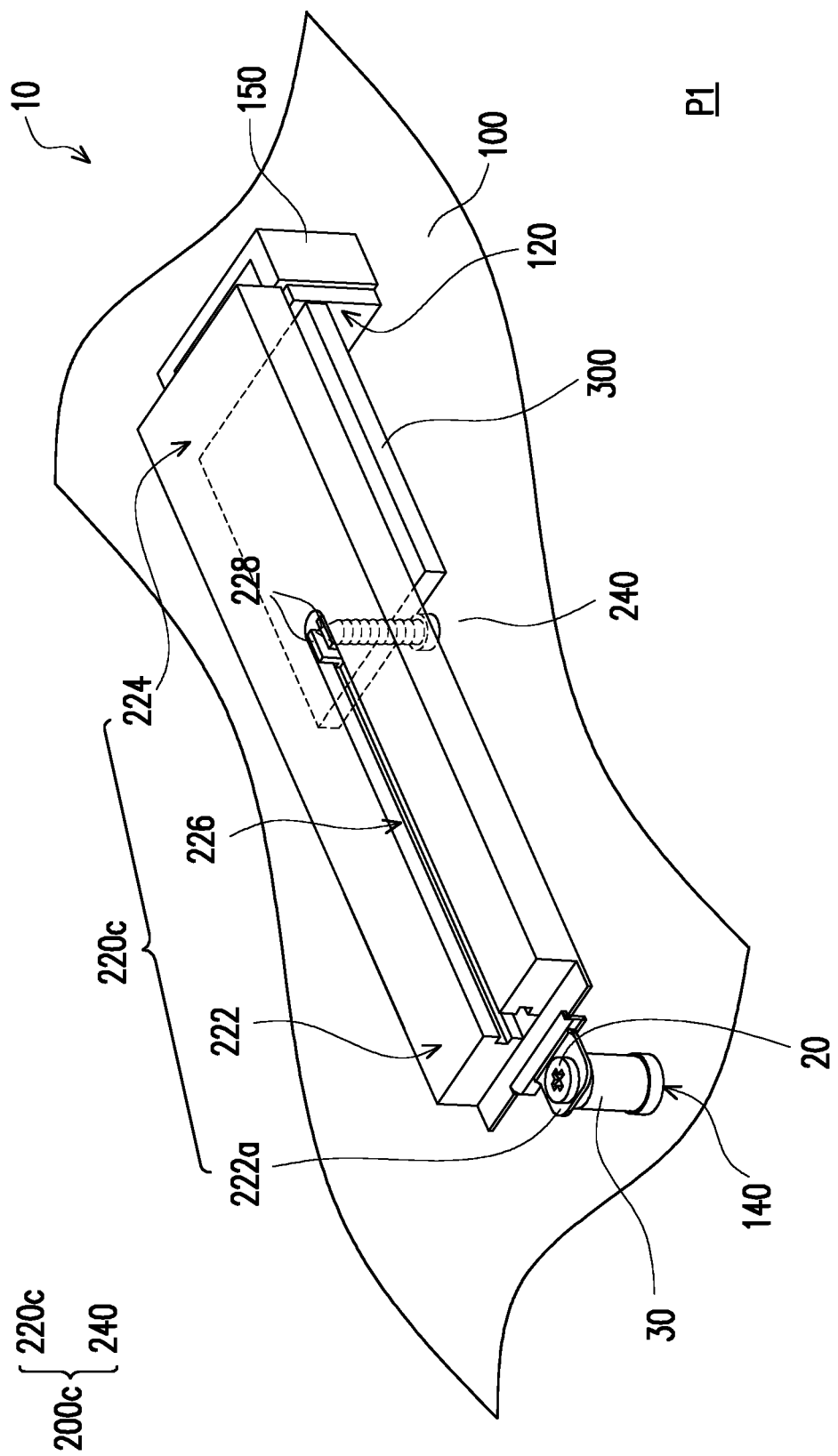
FIG. 7 is a schematic of an electronic device of still yet another embodiment of the invention.
Figure 8:
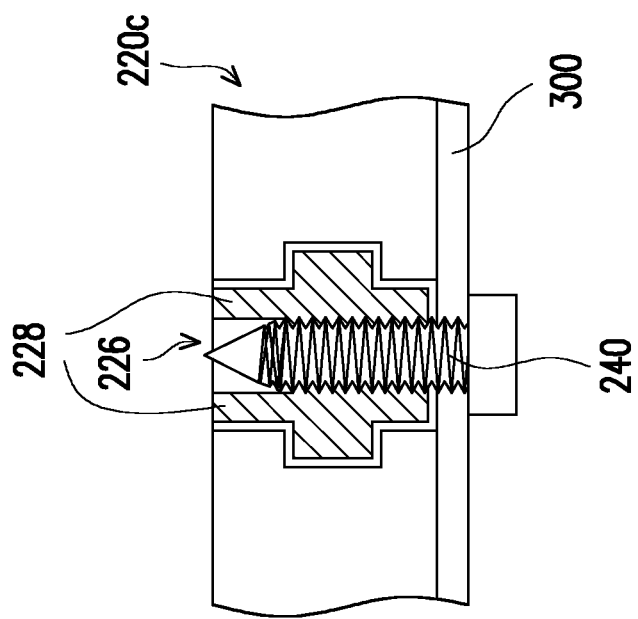
FIG. 8 is a partial schematic of a cross section of a heat dissipating assembly of an M.2 expansion card of the electronic device of FIG. 7 along the extending direction of the first end and the second end.

FIG. 7 is a schematic of an electronic device of still yet another embodiment of the invention. FIG. 8 is a partial schematic of a cross section of a heat dissipating assembly of an M.2 expansion card of the electronic device of FIG. 7 along an extending direction of a first end and a second end. Referring to FIG. 7 and FIG. 8 simultaneously, in the present embodiment, a heat dissipating body 220c of a heat dissipating assembly of M.2 expansion card 200c has a groove 226 extended from the position of the fixed portion 222a of the heat dissipating body 220c to a direction away from the first end 222 of the heat dissipating body 220c. The heat dissipating body 220c further includes a sliding member 228 slidably disposed in the groove 226. Moreover, the screw holes 227 of the heat dissipating body 220c are formed on the sliding member 228.

In detail, in the present embodiment, the screw hole on the sliding member 228 may be locked by the locking member 240. When the user needs to fix the M.2 expansion card 300 and the heat dissipating body 220c together by the locking member 240, the user may fix various sizes of the M.2 expansion card 300 using the characteristic that the sliding member 228 may slide freely in the groove 226.

That is, the user may fix various sizes of the M.2 expansion card 300 and the heat dissipating body 220c together in conjunction with the locking member 240 by sliding the sliding member 228 to the corresponding position. In this way, the manufacturer does not need to provide corresponding screw hole for each type of the M.2 expansion card 300 at the time of manufacture. Further, in the present embodiment, the issue that the heat dissipating assembly of M.2 expansion card 200c may not completely match various sizes of the M.2 expansion card 300 on the market due to the manufacturer not providing the screw hole corresponding to the M.2 expansion card 300 at the heat dissipating assembly of M.2 expansion card 200c does not occur. Further, the situation in which the sizes of the heat dissipating assembly of M.2 expansion card 200c and the M.2 expansion card 300 do not match and thus causing inconvenience to the user also does not occur.

Figure 9:
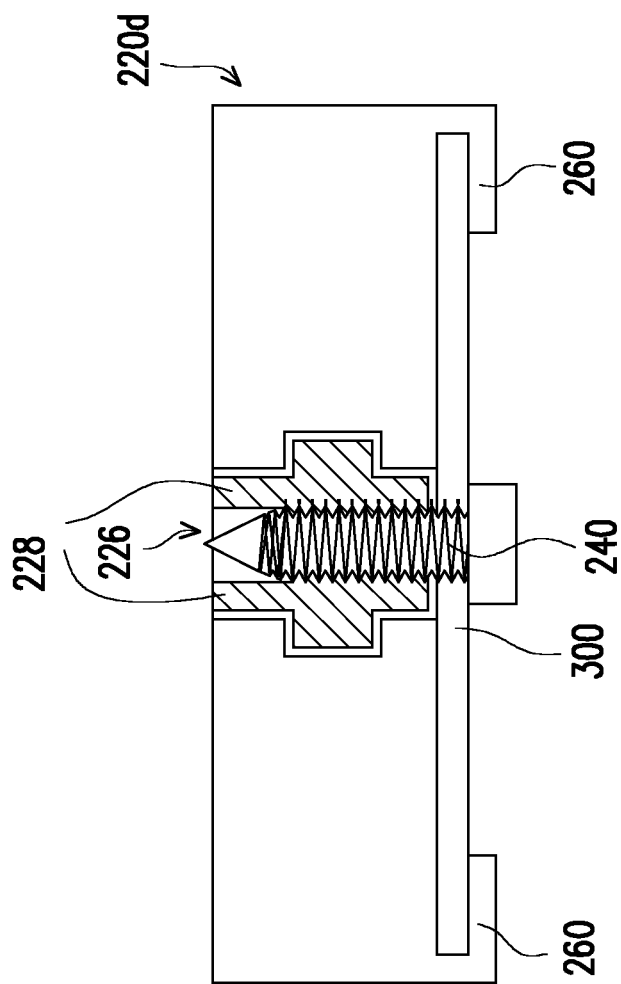
FIG. 9 is a cross section of a heat dissipating assembly of an M.2 expansion card of an electronic device along an extending direction of a first end and a second end according to still yet another embodiment of the invention.

FIG. 9 is a cross section of a heat dissipating assembly of an M.2 expansion card of an electronic device along an extending direction of a first end and a second end according to still yet another embodiment of the invention. Referring to FIG. 9, in the present embodiment, At least one clamping arm 260 is extended from at least one side of the heat dissipating body 220d, and the clamping arm 260 may detachably clamp the M.2 expansion card 300. Moreover, the heat dissipating body 220d has a groove 226. The heat dissipating body 220d further includes a sliding member 228 slidably disposed in the groove 226. Moreover, the screw hole 227 of the heat dissipating body 220d are formed on the sliding member 228.

In the present embodiment, as shown in FIG. 9, the heat dissipating assembly of M.2 expansion card has the clamping arm 260 in the embodiment of FIG. 6 and the sliding member 228 in the embodiments of FIG. 7 and FIG. 8 at the same time. In short, the present embodiment combines the technical features of the above two embodiments while having the advantages of the technical features of the two embodiments. As a result, the user may more stably and conveniently fix the M.2 expansion card to the motherboard.

It should be noted that the related technical details of the present embodiment are similar to the embodiment of FIG. 6 and the embodiments of FIG. 7 and FIG. 8 and therefore are not repeated herein. It is worth mentioning that the locking member 240 shown in FIG. 6 to FIG. 9 is, for example, a screw. Of course, in an embodiment not shown, the locking member 240 may also be, for example, a stud (the locking member 240a), and the invention is not limited thereto.

Based on the above, the heat dissipating assembly of M.2 expansion card of the electronic device of the invention not only may provide heat dissipation function to the M.2 expansion card, the user may also fix the M.2 expansion card on the motherboard through the heat dissipating assembly of M.2 expansion card. In other words, the user may also first fix the M.2 expansion card and the heat dissipating body through the locking member and then fix the heat dissipating body and the M.2 expansion card together on the motherboard through the fixed portion located at the first end of the heat dissipating body and the M.2 fixing hole on the motherboard. In addition, the electronic device of the invention allows the manufacturer to simply provide a single M.2 fixing hole adjacent to each M.2 connector on the motherboard, and other M.2 fixing holes additionally provided adjacent to the M.2 connector in the prior art may be omitted. Therefore, the heat dissipating assembly of M.2 expansion card of the electronic device of the invention improves the conventional structure of fixing the M.2 expansion card on the motherboard. Therefore, the degree of freedom in the design of the wiring and configuration of devices of the motherboard by those skilled in the art is increased. Further, the electronic device of the invention is also more capable of adapting to the trend of continuous increase in data transmission volume and transmission speed in the future.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An electronic device adapted to configure an M.2 expansion card, comprising:
   a motherboard comprising an M.2 connector and a single M.2 fixing hole; and
   a heat dissipating assembly of the M.2 expansion card detachably disposed at a portion on the motherboard adjacent to the M.2 connector and adapted to fix the M.2 expansion card on the motherboard, the heat dissipating assembly of the M.2 expansion card comprising:
      a heat dissipating body having a first end and a lower surface facing the motherboard, and comprising:
         a fixed portion located at the first end and detachably fixed on the M.2 fixing hole of the motherboard, wherein the fixed portion is a snap; and
         at least one screw hole; and
      a locking member detachably disposed on the at least one screw hole and adapted to fix the M.2 expansion card to the heat dissipating body, wherein the locking member is a stud without a nut, the stud has a screw thread on an outer surface thereof, and the screw thread is adapted to directly contact the at least one screw hole, wherein the at least one screw hole comprises a plurality of screw holes, the locking member is detachably disposed on one of the screw holes, and the screw holes are spaced apart on the heat dissipating body, and the locking member is adapted to lock one of the screw holes through the lower surface of the heat dissipating body, wherein the M.2 connector has only the single M.2 fixing hole corresponding the M.2 connector, and no other M.2 fixing hole is disposed between the M.2 connector and the single M.2 fixing hole.

2. The electronic device of claim 1, wherein the heat dissipating assembly of the M.2 expansion card further has at least one clamping arm extended from at least one side of the heat dissipating body, the at least one clamping arm is adapted to detachably clamp the M.2 expansion card, and when the M.2 expansion card is disposed on the heat dissipating assembly, the heat dissipating body is located on one surface of the M.2 expansion card, and the at least one clamping arm is hooked on another surface of the M.2 expansion card.

3. The electronic device of claim 1, wherein the heat dissipating body has a second end opposite to the first end, the heat dissipating body further comprises a tongue located at the second end, the motherboard further comprises a tongue slot located on the M.2 connector and corresponding to the tongue, and the tongue is extended into the tongue slot when the heat dissipating assembly of the M.2 expansion card is disposed on the motherboard.

* * * * *